(12) United States Patent
Janse et al.

(10) Patent No.: US 10,270,203 B2
(45) Date of Patent: Apr. 23, 2019

(54) ADAPTER HOUSING WITH SOCKET FOR WATERPROOF MOUNTING A POWER SUPPLY TO AN APPLIANCE

(71) Applicant: FRIWO Gerätebau GmbH, Ostbevern (DE)

(72) Inventors: Christopher Janse, Münster (DE); Jörg Wochnik, Hagen aTW (DE)

(73) Assignee: FRIWO Gerätebau GmbH, Ostbevern (DE)

( * ) Notice: Subject to any disclaimer, the term of this patent is extended or adjusted under 35 U.S.C. 154(b) by 0 days.

(21) Appl. No.: 16/001,120

(22) Filed: Jun. 6, 2018

(65) Prior Publication Data

US 2018/0358738 A1   Dec. 13, 2018

(30) Foreign Application Priority Data

Jun. 8, 2017   (EP) ..................................... 17174993

(51) Int. Cl.

| | |
|---|---|
| *H01R 12/00* | (2006.01) |
| *H01R 13/52* | (2006.01) |
| *H01R 31/06* | (2006.01) |
| *H01R 13/74* | (2006.01) |
| *H01R 13/405* | (2006.01) |
| *H01R 13/504* | (2006.01) |
| *H05K 5/00* | (2006.01) |

(52) U.S. Cl.
CPC ....... *H01R 13/5202* (2013.01); *H01R 13/405* (2013.01); *H01R 13/504* (2013.01); *H01R 13/74* (2013.01); *H01R 31/065* (2013.01); *H05K 5/003* (2013.01)

(58) Field of Classification Search
CPC .............. H01R 13/5202; H01R 13/405; H01R 13/504; H01R 13/74; H01R 31/065; H05K 5/003
USPC ......................................... 439/76.1, 519–521
See application file for complete search history.

(56) References Cited

U.S. PATENT DOCUMENTS

| | | | |
|---|---|---|---|
| 4,408,171 | A | 10/1983 | Akino et al. |
| 5,475,347 | A | 12/1995 | Kwak |
| 2010/0144194 | A1 | 6/2010 | Umei et al. |
| 2016/0226394 | A1 | 8/2016 | Seok |

OTHER PUBLICATIONS

Extended European Search Report for Application No. 17174993.0 dated Nov. 3, 2017 (4 pages).

*Primary Examiner* — Khiem Nguyen
(74) *Attorney, Agent, or Firm* — Michael Best & Friedrich LLP

(57) ABSTRACT

An adapter housing for waterproof mounting a power supply circuit to an exterior wall of an appliance. The wall has an opening for a plug to connect the socket. The adapter includes a front wall having a connecting area and a mounting area; and a sealing element connected to the front wall. The sealing element surrounds the connecting area and the mounting area. The front wall opens at the connecting area into a recess defining a socket for receiving a plug. The front wall enables a sealed mounting to an exterior wall of the appliance. A side wall, together with the front wall, defines a compartment for receiving a power supply circuit. The sealing element surrounds the connecting area and the mounting area on the front wall such that it seals the compartment from an opening of the exterior wall.

15 Claims, 7 Drawing Sheets

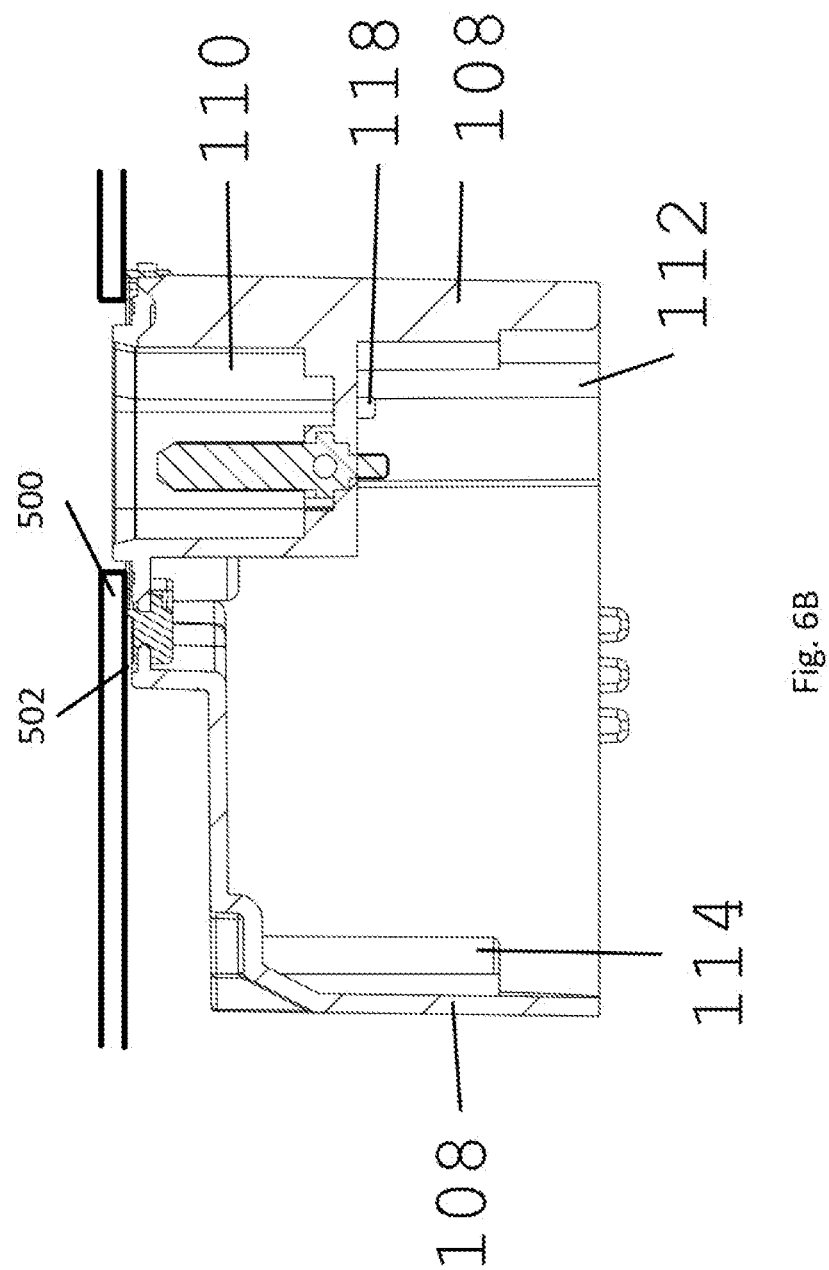

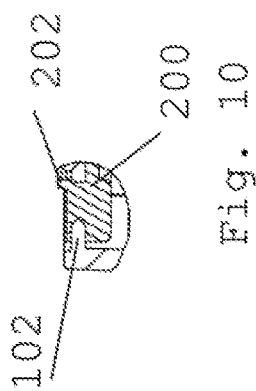
Fig. 10
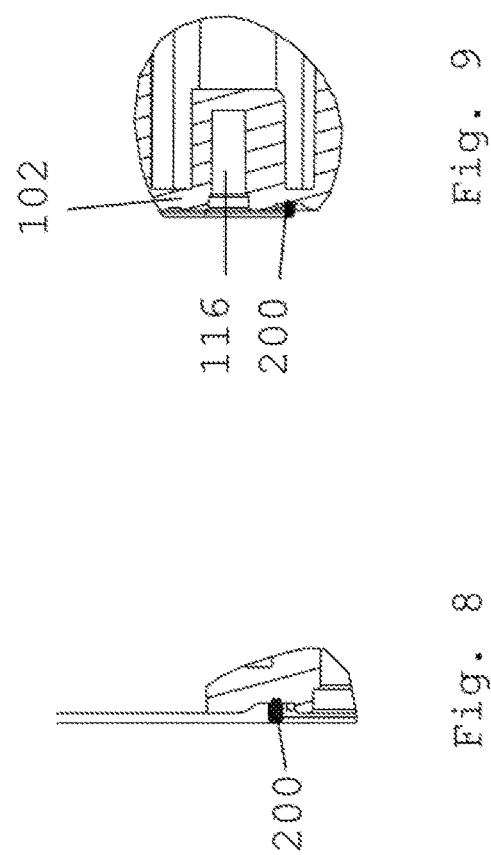
Fig. 9
Fig. 8

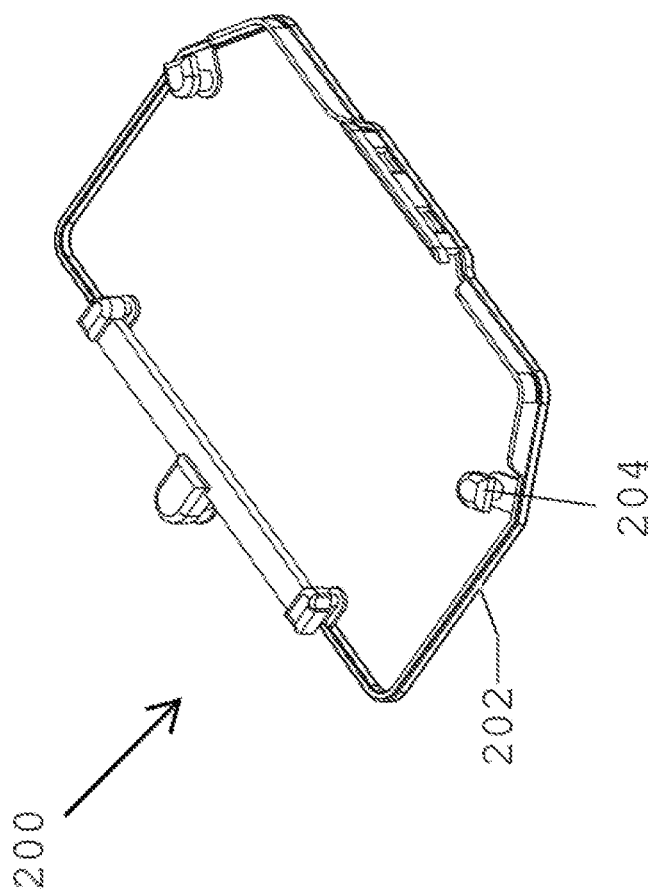

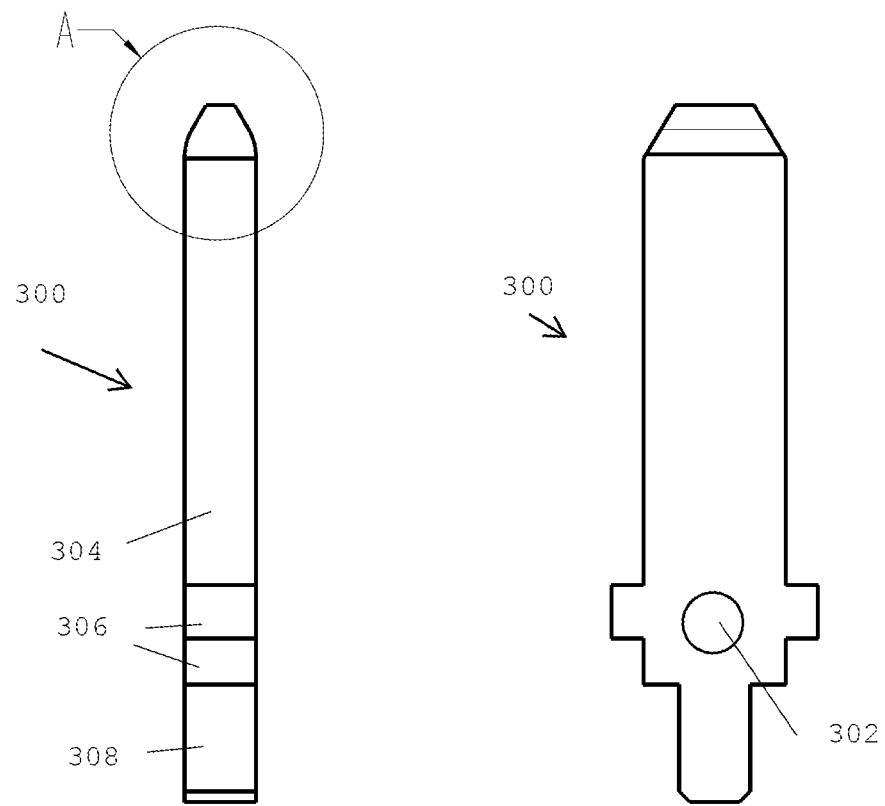
Fig. 12
Fig. 13
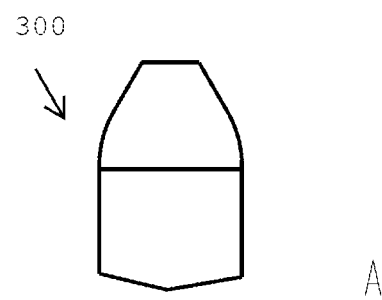
Fig. 14

ADAPTER HOUSING WITH SOCKET FOR WATERPROOF MOUNTING A POWER SUPPLY TO AN APPLIANCE

FIELD

Embodiments relate to an adapter housing with a socket for waterproof mounting a power supply circuit to an exterior wall of an appliance, wherein the wall of the appliance has an opening for a plug to connect the socket.

Power supply circuits are devices that supply electric energy to an electric appliance. One primary function of a power supply circuit is to convert one form of electrical energy, usually received from an external network, to another form of electrical energy, supplied to the appliance. In order to provide a simple and reliable connection to the external electrical network the power supply may comprise a socket conforming with the norm IEC 60320, which is incorporated by reference [DIN EN 60320-3 (VDE 0625-3): 2015-11 *Appliance couplers for household and similar general purposes—Part 3 Standard sheets and gauges (IEC 60320-3:2014); German version EN 60320-3:2014.* VDE-Verlag, Berlin].

It is necessary for certain applications, e.g. for an infusion pump, that the power supply circuit can be waterproof mounted to an external wall of the appliance so that the appliance can be operated in a moist environment. Here, the protection classes IPx4 to IPx7 have to be observed.

As is generally known, the so-called IP code (Ingress Protection) relates to protection against liquid ingression. A housing for the power supply can provide protection against splashing of water (IPx4) or a temporary submersion (IPx7) according to the standard DIN EN 60529, which is incorporated by reference [DIN EN 60529 (VDE 0470-1): 2014-09 *Protection Classes by casings (IP-Code) (IEC 60529: 1989+A1:1999+A2:2013); German Version EN 60529: 1991+A1:2000+A2:2013.* VDE-Verlag, Berlin].

SUMMARY

The object underlying the disclosed embodiments is to connect a power supply to a socket and assemble the power supply in a waterproof manner into an appliance. A further object underlying the disclosed embodiments is to reduce the assembling complexity, as for example by improving the handling and increasing the alignment tolerances. Additionally, an object of the disclosed embodiments is to reduce the costs with respect to a waterproof mounting of a power supply circuit into an appliance.

The disclosed embodiments are based on the idea that an adapter housing comprises a socket for waterproof mounting a power supply circuit to an exterior wall of an appliance, wherein the wall of the appliance has an opening for a plug to connect the socket.

According to embodiments disclosed, the adapter housing comprises a front wall, which comprises a connecting area and a mounting area on the front wall, and a sealing element, which is non-detachably connected to the front wall, wherein the sealing element surrounds at least the connecting area and the mounting area on the front wall. The front wall is opening at the connecting area into a recess defining a socket for receiving a plug and the front wall further enables a sealed mounting to an exterior wall of an appliance at the mounting area. A side wall together with the front wall defines a compartment for receiving a power supply circuit wherein the sealing element surrounds at least the connecting area and the mounting area on the front wall such that, when mounted to the exterior wall of the appliance, it seals the compartment from an opening of the exterior wall.

The front wall and the side wall of the adapter housing form a structural unit, which is preferably manufactured as one piece by a process such as injection-moulding or casting. This structural unit itself serves as the socket, which can connect to a plug, and additionally as the compartment, which can receive the power supply circuit that preferably is assembled on a printed circuit board (PCB).

Additionally, the sealing element, preferably made of a thermoplastic elastomer resin such as Hytrel©, is connected non-detachably to the front wall, and thus, non-detachably connected to the adapter housing. According to one embodiment, a non-detachable connection can be realized by manufacturing the sealing element together with the structural unit by a two-component injection-molding process. However, alternative solutions for non-detachable connections, such as an adhesive bonding or the like, are obvious for a person skilled in the art.

The sealing element divides the adapter housing into a sealed part and a non-sealed part. The sealed part comprises the compartment for receiving the power supply circuit. The non-sealed part comprises the mounting area and the connection area, wherein the latter defines the socket by a recess.

It is intended to waterproof mount the power supply circuit into the appliance. In particular, the appliance has an exterior wall, which has an opening through which a plug can be inserted from the outside of the appliance to contact the socket. Thus, the socket of the adapter housing needs to be aligned in a first step with respect to the opening of the exterior wall and in a second step the compartment for receiving the power supply circuit needs to be waterproof mounted to the exterior wall of the appliance.

Therefore, an alignment procedure of the adapter housing to the opening of the exterior wall is subsequently described. In particular, the socket of the adapter housing is aligned so that through the opening of the exterior wall of the appliance the plug can connect to the socket. In other words, when the adapter housing is aligned, the socket forms a part of an outside surface of the exterior wall of the appliance.

According to the second step of the mounting process, the aligned adapter housing is attached to the exterior wall of the appliance. In particular, the mounting area is attached to an inside surface of the exterior wall so that the sealing element, which surrounds the mounting area, seals the sealed part, which comprises the receiving side of the compartment for receiving the power supply circuit, from the non-sealed part, which comprises the socket to connect through the opening in the exterior wall of the appliance to a plug. The sealing element seals by being pressed to the inside surface of the exterior wall. In particular, an attracting force is applied between the mounting area on the front wall of the adapter housing and the inside surface of the exterior wall of the appliance. This attracting force can be applied by fastening elements such as screws, which connect mechanically the exterior wall and the front wall. However, alternative solutions for an attracting force can be provided by a shrinking adhesive, which adhesively bonds the mounting area on the front wall to the inside surface of the exterior wall, or the like.

This enables a simple handling and reliable aligning when mounting the socket, the compartment for receiving the power supply circuit, and the sealing element to the exterior wall of the appliance. Moreover, when mounted to the exterior wall of the appliance the adapter housing enables that the receiving side of the compartment for receiving the power supply circuit is sealed from the outside surface of the exterior wall of the appliance, which is partly formed by the socket, against splashing of water according to the IPx4 standard.

According to one advantageous embodiment, the mounting area is arranged in a flat surface of the front wall for a flush mounting of the adapter housing to the exterior wall of the appliance. A flush mounting enables to increase the tolerances, which have to be met during the assembling process, and ensuring the sealing properties of the adapter housing, when mounted to the exterior wall of the appliance. The flat surface is flat in a direction opposing the direction defined by the recess forming the socket and can comprise recess for fastening elements for applying an attracting force between the mounting are on the front wall and the inside surface of the exterior wall of the appliance.

Further, according to another embodiment, the compartment, defined by the side wall together with the front wall, has an opening facing in a direction opposite to the opening of the recess defining the socket. This opening allows manufacturing the adapter housing by a process such as injection molding and simplifies the inserting of the printed circuit board (PCB) of the power supply circuit.

According to another embodiment, the socket is conforming to the norm IEC 60320.

Further, according to another embodiment, the compartment, defined by the side wall together with the front wall, is extending laterally from the mounting area.

According to another embodiment, the compartment is provided on its receiving side with a guide notch for inserting a printed circuit board of the power supply circuit. Further, the compartment is provided on its receiving side with a protrusion forming a spacer for spacing the printed circuit board of the power supply circuit at a prescribed distance from the front wall. Thus, the integration of the PCB of the power supply circuit is simplified and a reliable positioning of the PCB in the compartment is provided.

Further, according to another embodiment, the mounting area on the front wall comprises at least one recess for receiving a fastening element. Such fastening elements enable to mount the mounting area to the exterior wall, and thus, to provide the attracting force so that the sealing element operates in a sealing manner. Additionally, such recesses enable that user specific external parts can be easily mounted to the adapter housing without influencing the sealing properties of the mounted adapter housing.

According to another embodiment, the adapter housing with socket comprises at least one contact pin, wherein a part of the contact pin is over-molded within the front wall enabling a sealed mounting therein. Additionally or alternatively, the contact pin comprises an opening and a part of the contact pin with the opening is over-molded within the front wall, enabling a non-detachable and sealed mounting of the contact pin. Further, according to another embodiment, the contact pin is extending into the socket and extending into the compartment enabling an electric connection between the socket and the compartment.

An over-molded contact pin enables that the connection between the contact pin and the socket is conforming to the standard IPx7, and thus enables a protection against temporary submersion.

According to another embodiment, the adapter housing further comprises at least one connecting element for connecting a contact pin to the power supply circuit, wherein the connecting element comprises a cut through defining a flap, the flap is mechanically and electrically contacting the connection element to the contact pin. Additionally or alternatively the connecting element comprises an opening and the compartment further comprises a notch that engages the opening so as to lock the connecting element at a prescribed position within the compartment. Additionally or alternatively, the connecting element comprises a shaft with a lateral width and the compartment comprises a guide rail that guides the shaft so as to lock the connecting element at a prescribed position within the compartment.

Such a modular contact pin allows a flexible and economic mounting of the connecting element to the adapter housing. Furthermore, the connecting element provides a robust and simple mounting of the power supply circuit to the adapter housing.

Further, according to another embodiment, the adapter housing with the front and side wall and the non-detachable connected sealing element is manufactured by a two-component injection-molding process. Advantageously, the sealing element comprises a sealing lip. Preferably, the sealing element extends into the receiving side of the compartment and comprises a barb such that the sealing element is non-detachably connected to the front wall Thus, the adapter housing and the sealing element can be manufactured easily and efficiently by a single injection molding machine.

According to another embodiment, the side wall is provided with at least one cable guide element for guiding and additionally or alternatively protecting an isolated cable connecting the power supply circuit and the appliance.

Further, according to another embodiment, further comprising a printed circuit board of the power supply circuit, wherein the printed circuit board is mounted in the receiving part of the compartment.

BRIEF DESCRIPTION OF THE DRAWINGS

The accompanying drawings are incorporated into the specification and form a part of the specification to illustrate several embodiments. These drawings, together with the description serve to explain the principles of disclosed embodiments. The drawings are merely for the purpose of illustrating the preferred and alternative examples of how the disclosed embodiments can be made and used, and are not to be construed as limiting the disclosed embodiments to only the illustrated and described embodiments. Furthermore, several aspects of the embodiments may form—individually or in different combinations—solutions according to the disclosed embodiments. The following described embodiments thus can be considered either alone or in an arbitrary combination thereof. Further features and advantages will become apparent from the following more particular description of the various embodiments of the disclosed embodiments, as illustrated in the accompanying drawings, in which like references refer to like elements, and wherein:

FIG. 6B is a sectional view along the line VI-VI of FIG. 4;

FIG. 8 shows the detail VIII of FIG. 5;

FIG. 9 shows the detail IX of FIG. 5;

FIG. 10 shows the detail X of FIG. 6;

FIG. 11 is a schematic perspective view of the sealing element according to some embodiments;

FIG. 12 is a schematic side view of the contact pin according to some embodiments;

FIG. 13 is a schematic side view of the contact pin according to some embodiments;

FIG. 14 shows the detail A of FIG. 12;

DETAILED DESCRIPTION

Figure 1:
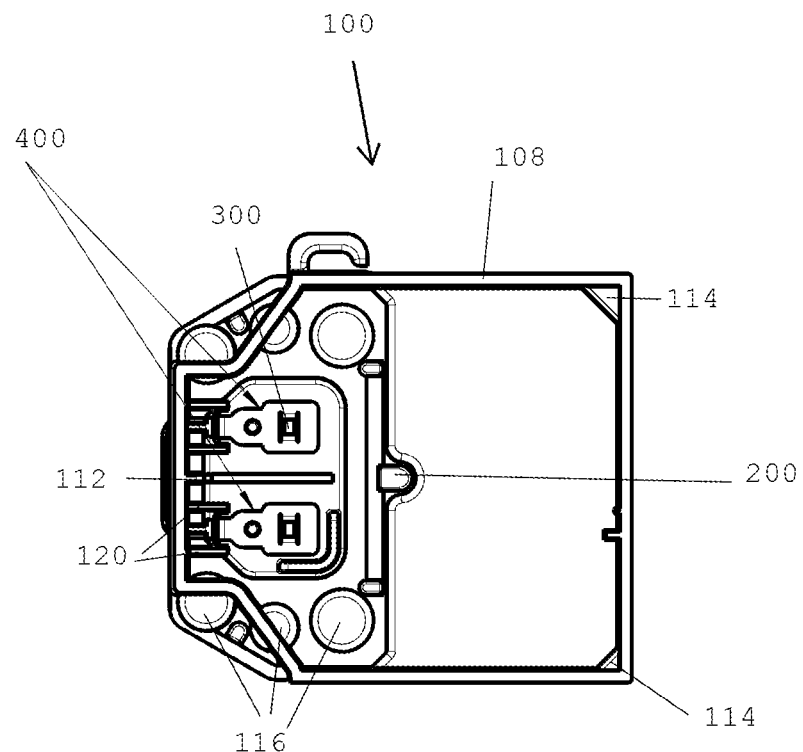
FIG. 1 is a schematic planar view of an adapter housing showing the receiving side of a compartment with mounted contact pins and mounted connecting elements according to some embodiments.
Figure 2:
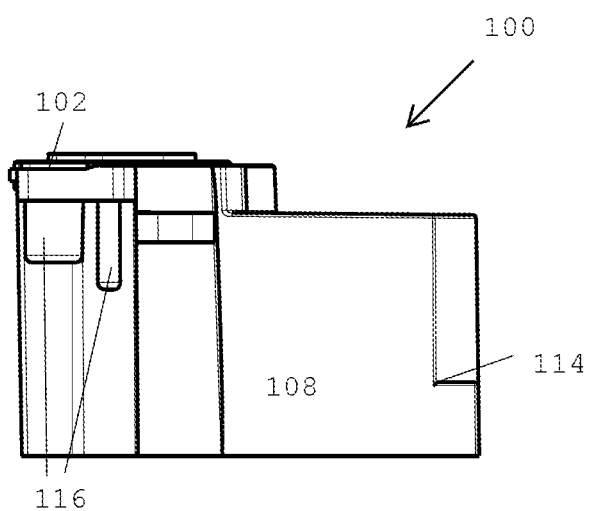
FIG. 2 is a schematic side view of the adapter housing according to some embodiments.

Embodiments will now be explained in more detail with reference to the Figures and firstly referring to FIG. 1, which shows a schematic planar view of the adapter housing 100 at the receiving side of the compartment with mounted contact pins 300 and mounted connecting elements 400 according to the present embodiment. FIG. 2 shows a side view of FIG. 1.

The adapter housing 100 comprises the compartment, which is formed by a front wall 102 and a side wall 108. The compartment is adapted to receive a printed circuit board (PCB) of a power supply circuit and the power supply circuit is operable to convert an input electric energy, which is received from an external electrical network, to an output electric energy, which is supplied to an appliance. The PCB with the power supply circuit, the external network, and the appliance are not shown in the drawings. An example for an appliance is an infusion pump.

In more detail, the input electric energy is fed into the compartment by the contact pins 300, which are assembled in the front wall 102 of the adapter housing 100. The connecting elements 400 electrically connect the contact pins 300 and the power supply circuit. The power supply circuit converts the input electric energy and supplies the appliance with the converted output electric energy.

Figure 3:
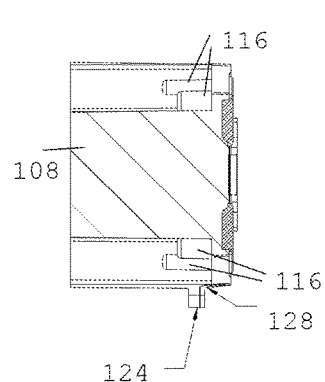
FIG. 3 is a sectional view along the line III-III of FIG. 7.
Figure 4:
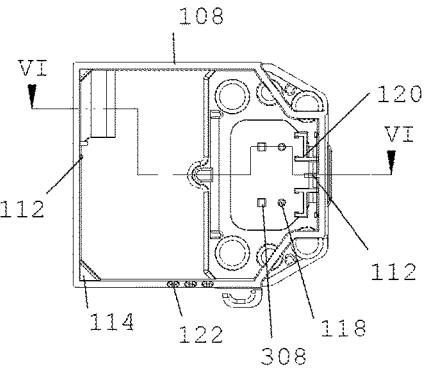
FIG. 4 is a schematic planar view of the adapter housing showing the receiving side of the compartment according to some embodiments.
Figure 5:
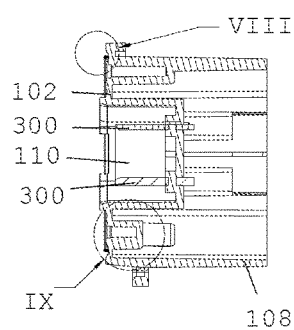
FIG. 5 is a sectional view along the line V-V of FIG. 7.
Figure 6A:
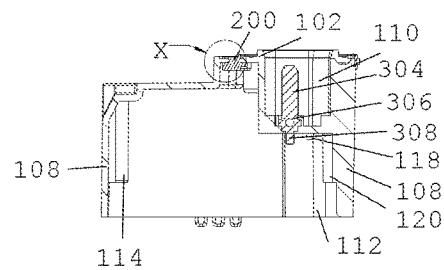
FIG. 6A is a sectional view along the line VI-VI of FIG. 4.
Figure 7:
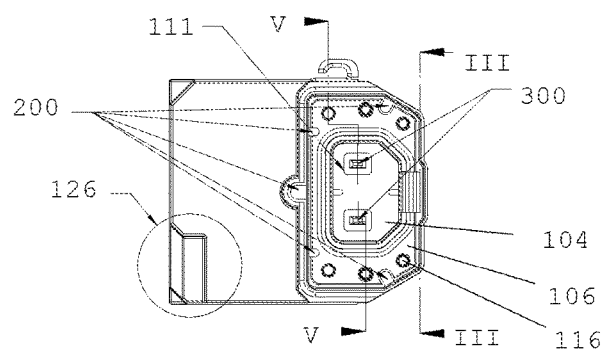
FIG. 7 is a schematic planar view of the adapter housing showing the connecting side of the socket according to some embodiments.

Now, with reference to FIGS. 3 to 7, details of the adapter housing 100 and details of the waterproof mounting of the power supply circuit to an external wall 500 of an appliance are shown. FIG. 4 shows a planar view of the receiving side of the compartment for receiving the power supply circuit. FIG. 7 shows a planar view of the connecting side of a socket 110, which is an integral part of the front wall 102. FIG. 3, FIG. 5, and FIG. 6A show sectional views along the indicated lines. FIG. 6B shows a schematic of the waterproof mounting to the exterior wall 500 of the appliance. According to the present embodiment, the adapter housing 100, comprising the front wall 102 and the side wall 108, is manufactured as one piece by a process such as injection molding or casting.

In more detail, as shown for example in FIG. 7, the front wall 102 comprises at the connecting side of the socket 110 a sealing element 200, which surrounds a non-sealed area on the front wall 102. The non-sealed area comprises a mounting area 106 and a connecting area 104 on the front wall 102. The connecting area 104 comprises a recess into the front wall 102, which defines the socket 110 that can be connected to the external network by a plug. The plug is not shown in the drawings.

Now with reference to FIG. 6A, the waterproof mounting of the adapter housing 100 to the external wall 500 of the appliance according to some embodiments is described in more detail. The receiving side of the compartment of the adapter housing 100 for receiving the power supply circuit is sealed from the non-sealed part, i.e. the connecting area 104 and the mounting area 106, when mounted to an exterior wall 500 of an appliance. In particular, the adapter housing 100 is mounted at the mounting area 106 to the exterior wall 500 of the appliance. The exterior wall 500 of the appliance has an opening through which the pug can connect to the socket 110. When the adapter housing 100 is mounted to the exterior wall 500 of the appliance the sealing element 200 is pressed to the inside surface 502 of the exterior wall 500. Thus, when mounted, the sealing element 200 seals the compartment for receiving the power supply circuit from an opening in the exterior wall 500 through which the socket 110 can receive the pug that enables a connection to an external network.

Now the sealing element 200 and the waterproof mounting are described in more detail with reference to FIG. 6A, FIG. 7, FIG. 10, and FIG. 11. FIG. 10 shows the detail X of FIG. 6A and FIG. 11 is a perspective view of the sealing element 200. The sealing element 200 is non-detachably connected to the front wall 102. According to the present embodiment, the sealing element 200 comprises barbs 204 for connecting the sealing element 200 non-detachably to the front wall 102. As detailed shown by FIG. 10 the barbs 204 extend into the compartment for receiving the power supply circuit. According to the present embodiment the sealing element 200 and the barbs 204 are manufactured as one piece. More precisely, the adapter housing 100 and the sealing element 200 are manufactured by a two component injection molding process.

According to some embodiments the sealing element 200 is made of a thermoplastic elastomer resin such as Hytrel©. However, embodiments are not limited to the embodiment that the sealing element 200 is manufactured together with the adapter housing 100 in a two component injection molding process. For example, the sealing element 200 may be glued to the front wall 102 in order to provide a non-detachable connection, and thus, also different materials may be used for the sealing element 200.

As best shown in FIG. 10, the sealing element 200 according to the present embodiment further comprises a sealing lip 202. The sealing lip 202 is extending from the non-detachably mounted sealing element 200 in a direction opposite to the direction defined by the recess forming the socket 110. The sealing element 200 with the sealing lip 202 is manufactured as one piece. The sealing element 200, and especially the sealing lip 202, surrounds the non-sealed part of the front wall 102. When the adapter housing 100 is mounted to the exterior wall 500, the sealing lip 202 is pressed to the inside surface 502 of the exterior wall 500, and thus, the compartment for receiving the power supply circuit is sealed from the non-sealed part of the front wall 102.

Now the mounting of the adapter housing 100 to the exterior wall 500 according to the present embodiment is detailed described with reference to FIG. 5, FIG. 6B, FIG.

7, and FIG. 9. FIG. 9 shows a detail of FIG. 5. The mounting area 106 on the front wall 102 enables a flush mounting of the adapter housing 100 to the exterior wall 500. In particular, the mounting area 106 is arranged on the front wall 102 between the sealing element 200 and the contacting area 104, which comprises the socket 110. The mounting area 106 further comprises recesses 116 in the direction defined by the recess forming the socket 110. Consequently, the mounting area 106 is flat with respect to a direction opposite to the direction defined by the recesses 116, and thus, a flush mounting to the exterior wall 500 is possible.

The recesses 116 receive, when the adapter housing 100 is mounted to the exterior wall 500, fastening elements which fix the adapter housing 100 to the exterior wall 500. Thus, an attractive force can be applied between the mounting area 106 on the front wall 102 and the inside surface 502 of the exterior wall 500. Consequently, the sealing element 200, and especially the sealing lip 202, is pressed to the inside surface 502 of the exterior wall 500, and thus, the receiving side of the compartment is sealed from the non-sealed part, i.e. the mounting area 106 and the connecting area 104 comprising the socket 110.

Embodiments, however, is not limited to a flush mounting according to the above. For example, the adapter housing 100 can be mounted to the exterior wall by a shrinking adhesive. The adhesive bonds the mounting area 106 on the front wall 102 to the inside surface 502 of the front wall 500. During the curing process, the adhesive shrinks and thus, an attractive force is applied between the mounting area 106 and the inside surface 502. Moreover, the mounting area 106 does not have to be arranged necessarily between the sealing element 200 and the connecting area 106. For example, the sealing element 200 may surround non abutting areas, one being the mounting area 104 and one being the connecting area 106. Furthermore, the mounting area 106 may comprise additional recesses 116 for attaching user specific external elements to the adapter housing 100.

The socket 110 for connecting to the pug is described in detail with reference to FIG. 5, FIG. 6A, and FIG. 7. According to some embodiments, the socket 110 is defined by a recess in the connecting area 104 on the front wall 102. In particular, according to the present embodiment, the socket 110 is manufactured as a one piece part of the adapter housing 100 by the injection molding process. The shape of socket 110 meets the requirements for a shape of a socket conforming to the norm IEC 60320. More precisely, the socket 110 with the contact pins 300 of the present embodiment is a socket conforming to a C17 norm socket. However, the disclosed embodiments are not limited to a C17 norm socket. According to some embodiments, the adapter housing with a differently shaped socket also enables the waterproof mounting of the power supply circuit to the exterior wall 500 of the appliance.

The contact pin 300 and the mounting of the contact pin 300 to the front wall 102 of the adapter housing 100 is described in detail with reference to FIG. 5, FIG. 6A, FIG. 7, and FIGS. 12 to 14. FIGS. 12 and 13 show schematic side views of the contact pin 300 and FIG. 14 shows a detail of FIG. 12. The contact pin 300 according to the present embodiment has a norm part 304, an over-molded part 306 with an opening 302, and a connecting part 308.

In more detail, as shown for example in FIG. 6A, the norm part 304 of the contact pin 300 extends into the socket 110, the over-molded part 306 with an opening 302 of the contact pin 300 is part of the front wall 102, and the connecting part 308 of the contact pin 300 extends into the compartment for receiving the power supply circuit. The contact pin 300 is manufactured as one piece and made of an electric conductive material, for example a metal. Thus, the contact pin 308 provides an electric connection between the socket 110 and the receiving side of the compartment.

The mounting of the contact pin is described in detail with reference to FIG. 6A. According to the present embodiment, the contact pin 300 is mounted to the adapter housing 100 in a sealing manner. In particular, the over-molded part 306 of the contact pin 300 is over-molded by the front wall 102 of the adapter housing 100 by an injection molding process, a casting process, or the like. Thus, the mounting of the contact pin 300 to the front wall 102 is conforming to the standard IPx7.

Moreover, the sealed mounting of the contact pin 300 to the front wall 102 is additionally non-detachable. In particular, the over-molded part 306 of the contact pin 300 comprises an opening 302 and is over-molded by an injection molding process, a casting process, or the like. Such a mounting of the contact pin 300 to the front wall 102 allows that the compartment for receiving the power supply circuit is sealed from the socket 110 with the mounted contact pin 300 in accordance with the standard IPx7 and that the mounting of the contact pin 300 to the front wall 102 is non-detachably.

However, some embodiments are not limited to a contact pin 300, which is over-molded by the front wall 102. The contact pin 300 can be waterproof mounted to the front wall 102 by a process such as gluing the contact pin 300 to the front wall 102.

The norm part 304 of the contact pin 300, which is extending into the socket 110, is described in detail with reference to FIG. 6A, FIG. 7, and FIGS. 12 to 14. The norm part 304 of the contact pin 300 according to the present embodiment has a shape conforming to the norm IEC 60320.

A polished area 111 is a polished part of the contacting area 104 that surrounds each norm part 308 of the contact pin 300 mounted to the front wall 102. The polished area 111 facilitates the demoulding process. Furthermore, the polished area 11 is easy to clean and visually appealing. The socket 110 and the norm part 308 of the contact pins 300 are manufactured conforming to the norm IEC 60320 and form a C17 socket. However, some embodiments are not limited to a C17 socket.

The connecting part 308 of the contact pin 300, which extends into the compartment for receiving the power supply circuit, is described in detail with reference to FIG. 4, FIG. 6A, and FIGS. 12 to 14. The connecting part 308 of the contact pin 300 forms a protrusion in the inner compartment, which enables an electric connection to the socket 110.

Now with reference to FIGS. 4 to 7, the receiving side of the compartment for receiving the power supply circuit is described. A base of the compartment is partly formed by the front wall 102. According to this embodiment, the base is formed by a polygon. In particular, the base is extending laterally from the mounting area 106 of the front wall 102. Thus, the receiving side of the compartment can meet the requirements of user specific applications, such as a space requirement given by the appliance 126, by offering space for the power supply circuit. However, the some embodiments are not limited to a specific shape of the base of the compartment.

The side wall 108 extends from the base, thereby enabling the injection molding manufacturing process of the present embodiment. Preferably the side wall 108 is arranged perpendicular to the base. Opposing to the base the compartment has an opening through which the mold can be extracted. The same opening additionally enables to insert the PCB of the power supply circuit. The side wall 108 follow the polygonal shape of the base, thereby forming the closed side wall 108 with edges at intersecting parts of the closed side wall 108. The base and the side wall 108 form an inner wall facing the receiving side of the compartment.

The inner wall of the compartment further comprises elements for inserting 112 and positioning 114 the PCB, as shown for example in detail in FIG. 4 and FIG. 6A. In particular, the compartment comprises guiding notches 112, which are integrally part of the side walls 108 of the adapter housing 100. The guiding notches guide the PCB, which preferably has corresponding recesses, when inserted into the compartment. For example, a guiding notch 112 according to the present embodiment is an integral part of the inner wall, arranged between to edges of the side wall 108, and extends from the base to the opening.

Furthermore, the inner wall of the compartment has protrusions forming spacers 114, which are arranged at edges of side wall 108, as shown for example in detail in FIG. 4 and FIG. 6A. The spacers 114 are integral parts of the side wall 108 and extend from the base into the direction of the opening of the compartment. The spacers 114 have a flat portion for positioning the PCB with respect to the base. According to the present embodiment, the flat portions are surfaces facing the opening of the compartment arranged between the base and the opening. Furthermore, the spacers 114 are formed at edges of the side wall 108.

Alternatively, a spacer can be arranged at any position in the receiving part of the compartment. For example, a spacer 114 may extend from the base without contact to the side wall 108.

Figure 15:
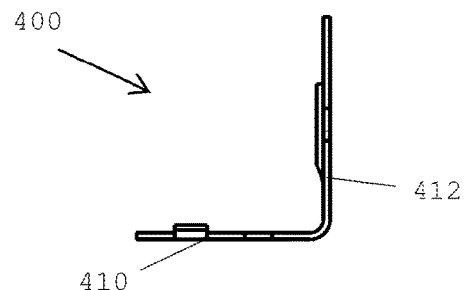
FIG. 15 is a schematic side view of the connecting element according to some embodiments.
Figure 16:
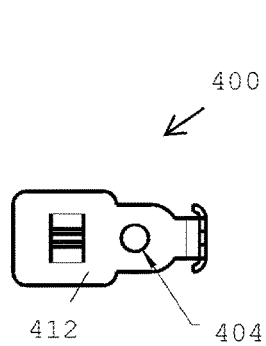
FIG. 16 is a schematic side view of the connecting element according to some embodiments.
Figure 17:
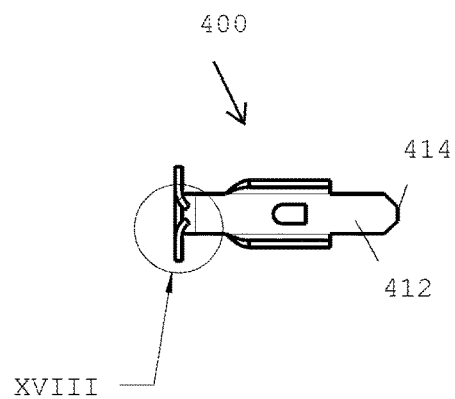
FIG. 17 is a schematic side view of the connecting element according to some embodiments.
Figure 18:
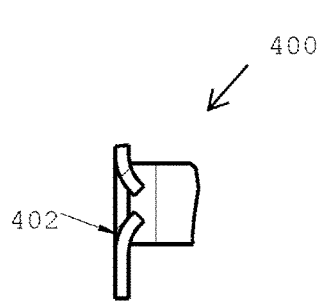
FIG. 18 shows the detail XVIII of FIG. 17.
Figure 19:
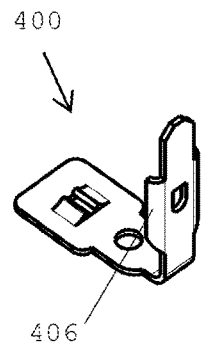
FIG. 19 is a schematic perspective view of the connecting element.

Now the connection of the connecting part 308 of the contact pin 300 to the power supply circuit is described. In particular, the connecting elements 400 and the connection of the connecting elements 400 to the receiving side of the compartment is described with reference to FIG. 1, FIG. 4, FIG. 6A, and FIGS. 15 to 19. FIG. 19 shows a perspective schematic view of the connecting element 400, FIGS. 15 to 17 show side views of FIG. 19, and FIG. 18 shows a detailed of FIG. 17.

According to the present embodiment, the connecting elements 400, which are made of an electrically conductive material such as a metal, connect to the compartment by a press fit. Thus, a fastening of the connecting element 400 and the compartment is achieved by friction after the parts are pushed together, rather than by any other means or fastening elements. However, some embodiments are not limited that the connecting elements 400 are fixed by interface fit to the adapter housing 100. For example, the connecting elements 400 can also be connected non-detachably to the adapter housing 100 by a process such as gluing the connecting element 400 to the adapter housing or by over-molding the connecting elements 400 by the adapter housing 100 within the manufacturing process of injection-molding the adapter housing 100.

The connecting element 400 is described in detail with reference to FIGS. 15 to 19. As may be derived especially from FIG. 19, the connecting element 400 is manufactured by stamping and bending a metal sheet. In more detail, as shown in FIGS. 15 to 18, the connecting element 400 comprises a first part 410 that is bent perpendicular to a second part 412. The first part 410 comprises a cut through forming two flaps 402 and a stamp out forming an opening 404. The second part 412 comprises at an end opposing to the end connecting to the first part 410 a stamped out tip 414 and the second part 412 comprises in a lateral direction thereto bended shafts 408 with a lateral width.

The first part 410 of the connecting element 400 and the connection of the same to the front wall 102 of the receiving side of the compartment is detailed described with reference to FIG. 4, FIG. 6A and FIG. 16. The front wall 102 of the receiving side of the compartment comprises elements for mounting the first part 410 of the connecting element 400. In particular, the connecting part 308 of the contact pin 300, which is connected to the front wall 102, extends into the receiving side of the compartment. When the connecting element 400 is mounted to the adapter housing 100 the connecting part 308 of the contact pin 300 engages the flaps 402 of the first part 410 of the connecting element 400 so as to mechanically and electrically connect the contacting element 400 to the contact pin 300. Furthermore, the front wall 102 of the receiving side of the compartment comprises a notch 118 extending into a direction of the opening of the compartment. When the connecting element 400 is mounted to the adapter housing 100 the notch 118 engages the opening 404 of the connecting element 400 so as to lock the connecting element 400 at a prescribed position within the compartment.

The second part 412 of the connecting element 400 and the connection of the same to the side wall 108 of the receiving side of the compartment is described in detailed with reference to FIG. 1, FIG. 4, FIG. 6A and FIG. 16. The side wall 108 of the receiving side of the compartment comprises elements for receiving and positioning the second part 412 of the connecting element 400. In particular, the side wall 108 comprises guiding rails 120 formed by integral protrusions extending from the side wall 108 into the receiving side of the compartment for guiding the connecting element 400 when inserting same into the receiving side of the compartment and for positioning the second part 412 of the connecting element 400 in a lateral direction with respect to the side wall 108. According to the present embodiment, each guiding rail 120 consists of two parallel protrusions perpendicular to the side wall 108. The bent shafts 408 with lateral width of the second part 412 engage with the guiding rail 120, and thus, the connecting element 400 is frictionally locked with the compartment.

Furthermore, each guiding rail 120 is operable for positioning the PCB with respect to the front wall 102 in a similar way as the spacers 114. In particular, the protrusions forming the guide rail 120 extrude from the base in the direction of the opening of the receiving side of the compartment and from a flat portion facing the opening. This flat portion is arranged between the base and the opening of the receiving side of the compartment and preferably forms together with the flat portions of the spacers 114 a supporting area for the PCB.

The tip 414 forming an end of the second part 412 of the connecting element 400 is adapted to being received by the PCB when the PCB is positioned in the compartment. Furthermore, the tip 414 is adapted to be soldered to the power supply circuit assembled on the PCB. Thus, the connecting element 400, mounted into the receiving side of the compartment, allows an electrical connection between the connecting part 308 of the contact pin 300, which is adapted to connect to the external network, and the power supply circuit, which is adapted to convert energy and supply with the converted energy the appliance, by soldering the power supply circuit to the tip 414.

The side wall 108 of the adapter housing 100 further comprises cable guiding elements 122, 124 to protect and guide a cable that connects the power supply circuit, which supplies the appliance with energy, and the appliance.

The cable guiding elements 122, 124 according to some embodiments described with reference to FIG. 3 and FIG. 4. The cable guiding elements 122, 124 are formed integrally with the adapter housing by the injection molding process. In particular, the side wall 108 of the adapter housing 100 comprises cable protecting elements 122 formed by notches with a smooth surface extending from the side wall 108 in the same direction as the side wall 108 extending from the front wall 102. The cable protecting elements 122 allow protecting the isolation of the cable connecting the power supply circuit and the appliance.

The side wall 108 further comprises a cable fixation element 124 formed by a hook extending perpendicular from an outer wall of the side wall 108. The outer wall of the side wall 108 opposes the inner wall of the side wall 108, which faces the receiving side of the compartment. The cable fixation element 124 enables to attach the cable, which connects the power supply circuit and the appliance, by additionally providing a stain relief. Preferably, a surface parallel to the front wall 102 of the cable fixation element 124 together with the outer wall of the side wall 108 defines a parting line 128 of the adapter housing 100.

Although in the Figures only an embodiment is shown wherein the socket is a C17 socket conforming to the norm IEC 60320, it is clear to a person skilled in the art that the concept according to some embodiments may also be used when providing any other socket. Furthermore, the above shown adapter housing 100 with the non-detachably connected sealing element 200 has not to be necessarily manufactured by a two-component injection-molding process.

REFERENCE NUMERALS

| Reference Numeral | Description |
|---|---|
| 100 | adapter housing |
| 102 | front wall |
| 104 | connecting area |
| 106 | mounting area |
| 108 | side wall |
| 110 | socket |
| 111 | polished area |
| 112 | guide notch |
| 114 | spacer |
| 116 | recesses |
| 118 | notch |
| 120 | guide rail |
| 122 | cable protecting element |
| 124 | cable fixation element |
| 126 | space requirement by an external appliance |
| 128 | parting line |
| 200 | sealing element |
| 202 | sealing lip |
| 300 | contact pin |
| 302 | contact pin opening |
| 304 | norm part |
| 306 | over-molded part |
| 308 | connecting part |
| 400 | connecting element |
| 402 | flap |
| 404 | opening |
| 406 | shaft |
| 410 | first part |
| 412 | second part |
| 414 | tip |
| 500 | exterior wall |
| 502 | inside surface of the exterior wall |

The invention claimed is:

1. An adapter housing (100) with a socket for mounting a power supply circuit waterproofly to an exterior wall of an appliance, wherein the exterior wall of the appliance has an opening for a plug to connect the socket, the adapter housing comprising:
    a front wall (102) including a connecting area (104) and a mounting area (106) on the front wall (102);
    a sealing element (200) including a sealing lip (202), the sealing element non-detachably connected to the front wall (102), wherein the sealing element (200) surrounds at least the connecting area (104) and the mounting area (106) on the front wall (102);
    the front wall (102) opening at the connecting area (104) into a recess defining a socket (116) for receiving a plug;
    the front wall (102) further enabling a sealed mounting to the exterior wall (500) of the appliance at the mounting area (106); and
    a side wall (108), which together with the front wall (102), defines a compartment for receiving a power supply circuit
    wherein the sealing lip (202) surrounds at least the connecting area (104) and the mounting area (106) on the front wall (102) such that, when mounted to the exterior wall (500) of the appliance, it seals the compartment waterproofly from an opening of the exterior wall (500).

2. The adapter housing with socket according to claim 1, wherein the mounting area (106) is arranged in a flat surface of the front wall (102) for a flush mounting of the adapter housing (100) to the exterior wall (500) of the appliance.

3. The adapter housing with socket according to claim 1, wherein the compartment, defined by the side wall (108) together with the front wall (102), has an opening facing in a direction opposite to the opening of the recess defining the socket (116).

4. The adapter housing with socket according to claim 1, wherein the socket (116) is conforming to the norm IEC 60320.

5. The adapter housing with socket according to claim 1, the compartment, defined by the side wall (108) together with the front wall (102), is extending laterally from the mounting area (106).

6. The adapter housing with socket according to claim 1, wherein the compartment is provided on its receiving side with a guide notch (112) for inserting a printed circuit board of the power supply circuit.

7. The adapter housing with socket according to claim 1, wherein the compartment is provided on its receiving side with a protrusion forming a spacer (114) for spacing the printed circuit board of the power supply circuit at a prescribed distance from the front wall (102).

8. The adapter housing with socket according to claim 1, wherein the mounting area on the front wall comprises at least one recess (116) for receiving a fastening element.

9. The adapter housing with socket according to claim 1, further comprises at least one contact pin (300),
    wherein a part (306) of the contact pin (300) is over-molded within the front wall (102) enabling a sealed mounting therein, and/or
    wherein the contact pin (300) comprises an opening (302) and a part (306) of the contact pin (300) with the opening (302) is over-molded within the front wall (102) enabling a non-detachable and sealed mounting of the contact pin (300).

10. The adapter housing with socket according to claim 9, wherein the contact pin (300) is extending into the socket (116) and extending into the compartment enabling an electric connection between the socket (116) and the compartment.

11. The adapter housing with socket according to claim 1, further comprises at least one connecting element (400) for connecting a contact pin (300) to the power supply circuit, wherein
the connecting element (400) comprises a cut through defining a flap (402), the flap is mechanically and electrically contacting the connection element (400) to the contact pin (300), and or
the connecting element (400) comprises an opening (404) and the compartment further comprises a notch (118) that engages the opening (404) so as to lock the connecting element (400) at a prescribed position within the compartment, and/or
the connecting element (400) comprises a shaft (406) with a lateral width and the compartment comprises a guide rail (120) that guides the shaft (406) so as to lock the connecting element (400) at a prescribed position within the compartment.

12. The adapter housing with socket according to claim 1, wherein the adapter housing (100) with the front and side wall (102,104) and the non-detachable connected sealing element (200) is manufactured by a two-component injection-molding process.

13. The adapter housing with socket according to claim 1, wherein the sealing element (200) extends into the receiving side of the compartment and comprises a barb (204) such that the sealing element (200) is non-detachably connected to the front wall (102).

14. The adapter housing with socket according to claim 1, wherein the side wall (108) is provided with at least one cable guide element (122; 124) for guiding and/or protecting an isolated cable connecting the power supply circuit and the appliance.

15. The adapter housing with socket according to claim 1, further comprising a printed circuit board of the power supply circuit, wherein the printed circuit board is mounted in the receiving part of the compartment.

* * * * *